United States Patent
Poplevine et al.

(10) Patent No.: US 7,061,792 B1
(45) Date of Patent: Jun. 13, 2006

(54) LOW AC POWER SRAM ARCHITECTURE

(75) Inventors: Pavel Poplevine, Foster City, CA (US); Annie-Li-Keow Lum, Milpitas, CA (US); Hengyang Lin, San Jose, CA (US); Andrew J. Franklin, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/215,678

(22) Filed: Aug. 10, 2002

(51) Int. Cl.
- *G11C 11/00* (2006.01)
- *G11C 7/00* (2006.01)
- *G11C 8/00* (2006.01)

(52) U.S. Cl. ............. 365/154; 365/189.08; 365/195; 365/204; 365/214; 365/230.03; 365/230.06

(58) Field of Classification Search ........... 365/230.02, 365/230.03, 230.06, 196, 189.08, 154
See application file for complete search history.

(56) References Cited

U.S. PATENT DOCUMENTS

| | | | |
|---|---|---|---|
| 4,856,106 A | | 8/1989 | Teraoka |
| 5,276,650 A | | 1/1994 | Kubota |
| 5,428,574 A | | 6/1995 | Kuo et al. |
| 5,554,874 A | | 9/1996 | Doluca |
| 5,559,743 A | * | 9/1996 | Pascucci et al. ............. 365/200 |
| 5,602,786 A | * | 2/1997 | Pascucci et al. ............. 365/200 |
| 5,642,324 A | * | 6/1997 | Ghosh et al. .......... 365/230.03 |
| 5,654,914 A | | 8/1997 | Nii et al. |
| 5,754,469 A | * | 5/1998 | Hung et al. ............. 365/185.03 |
| 5,764,572 A | * | 6/1998 | Hammick ............... 365/189.01 |
| 5,765,185 A | * | 6/1998 | Lambrache et al. ........ 711/103 |
| 5,818,754 A | * | 10/1998 | Ogura .................... 365/185.09 |
| 5,847,998 A | * | 12/1998 | Van Buskirk .......... 365/185.33 |
| 5,867,430 A | * | 2/1999 | Chen et al. ............ 365/189.04 |
| 5,963,493 A | | 10/1999 | Merritt et al. |
| 5,966,320 A | | 10/1999 | Hsu |
| 6,028,791 A | * | 2/2000 | Tanaka .................. 365/185.21 |
| 6,046,932 A | * | 4/2000 | Bill et al. .............. 365/185.02 |
| 6,061,286 A | * | 5/2000 | Baroni et al. ............... 365/203 |
| 6,111,786 A | * | 8/2000 | Nakamura ............. 365/185.11 |
| 6,130,846 A | | 10/2000 | Hori et al. |
| 6,134,176 A | * | 10/2000 | Proebsting ............. 365/230.06 |
| 6,219,280 B1 | * | 4/2001 | Naganawa ............. 365/185.22 |
| 6,288,969 B1 | | 9/2001 | Gibbins et al. |
| 6,298,005 B1 | | 10/2001 | Landry |
| 6,307,772 B1 | * | 10/2001 | Nagaoka ..................... 365/154 |
| 6,356,473 B1 | | 3/2002 | Shimoyama |
| 6,404,670 B1 | * | 6/2002 | Shau ........................... 365/154 |
| 6,452,851 B1 | * | 9/2002 | Endo et al. ................. 365/205 |
| 6,525,985 B1 | * | 2/2003 | Mizuno et al. ........ 365/230.03 |
| 6,563,730 B1 | | 5/2003 | Poplevine et al. |
| 6,577,534 B1 | * | 6/2003 | Tsuruda ................. 365/185.09 |
| 6,621,733 B1 | * | 9/2003 | Chiu ...................... 365/185.06 |
| 6,639,842 B1 | * | 10/2003 | Hoang et al. .......... 365/185.28 |
| 6,665,229 B1 | * | 12/2003 | Lee et al. .............. 365/230.06 |

(Continued)

*Primary Examiner*—Huan Hoang
*Assistant Examiner*—Ly Duy Pham
(74) *Attorney, Agent, or Firm*—Jurgen Vollrath (57) ABSTRACT

In a SRAM structure, power consumption is reduced by providing a structure which allows specific memory cells to be selected using word lines and column select lines, and reducing the load on the column address lines by dividing the load into sectors. The dividing into sectors is achieved by making use of sector select lines for selecting two or more rows of cells, and logically ANDing the sector select lines with the column select lines.

10 Claims, 7 Drawing Sheets

U.S. PATENT DOCUMENTS

| | | |
|---|---|---|
| 2001/0055225 A1* | 12/2001 | de Sandre et al. ...... 365/185.19 |
| 2002/0008992 A1* | 1/2002 | Tanaka et al. ......... 365/185.13 |
| 2002/0085418 A1* | 7/2002 | Goto et al. ............ 365/185.11 |
| 2002/0176312 A1* | 11/2002 | Lee et al. .............. 365/230.06 |
| 2002/0186590 A1* | 12/2002 | Lee ....................... 365/185.17 |
| 2003/0026124 A1* | 2/2003 | Nagaoka .................... 365/154 |
| 2003/0063494 A1* | 4/2003 | Kurosaki ............... 365/189.11 |
| 2003/0072176 A1* | 4/2003 | Watanabe .............. 365/185.18 |

* cited by examiner

LOW AC POWER SRAM ARCHITECTURE

FIELD OF THE INVENTION

The invention relates to semiconductor memories and in particular to Static Random Access Memory (SRAM), with a view to achieving power saving.

BACKGROUND OF THE INVENTION

Figure 1:
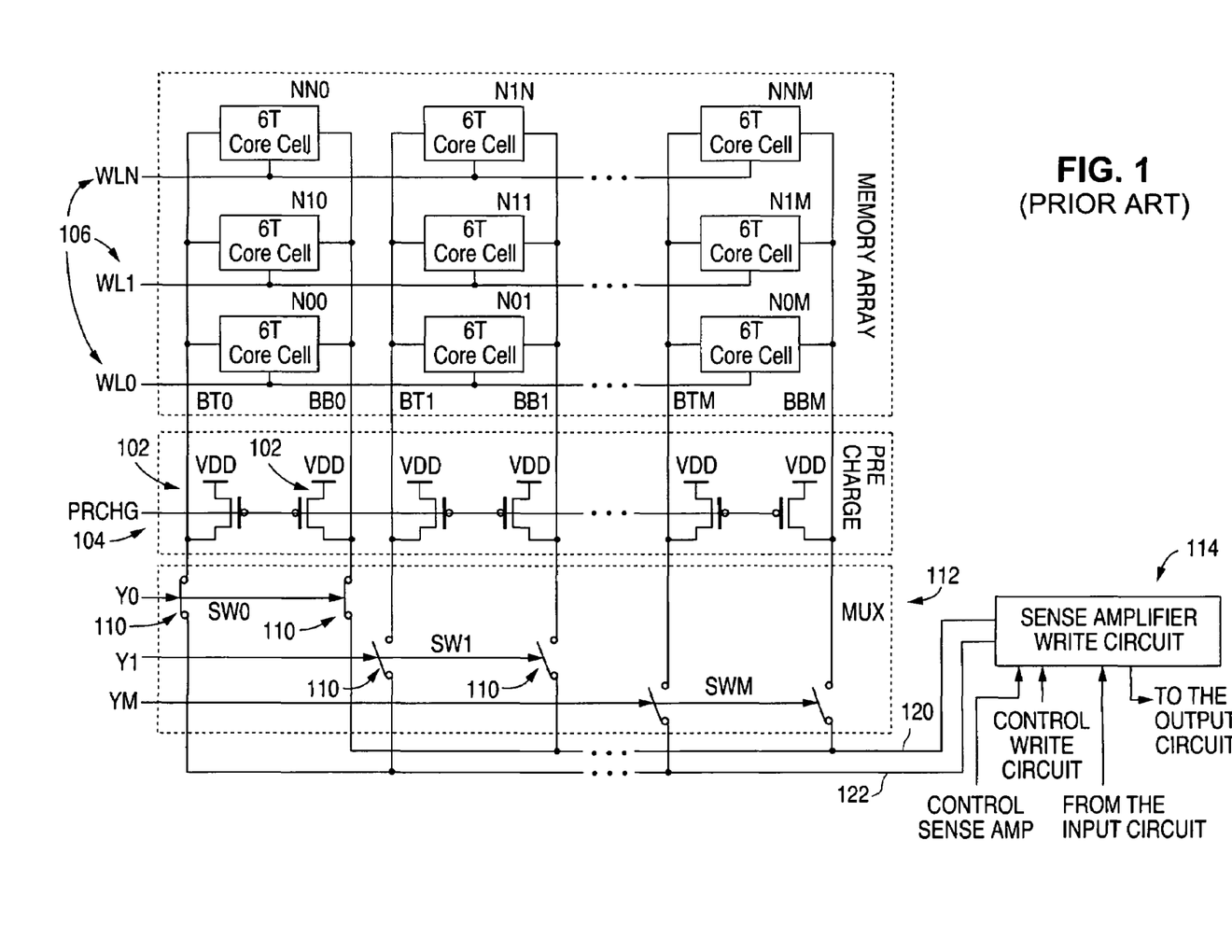
FIG. 1 is a schematic circuit diagram of a prior art SRAM structure.

Static Random Access Memory (SRAM) retains information by maintaining a differential charge across a pair of bit lines for each memory cell. One prior art SRAM structure is shown in FIG. 1. FIG. 1 shows a structure 100 of 6 transistor (6T) memory cells 200, each cell of which is shown in greater detail in FIG. 2. The 6T cell 200 includes a word line 202 and a pair of bit lines 204, 206. The word line 202 controls pass gates 208, 210 to allow discharging of the bit lines. The memory cell 200 is programmed or written to by applying a differential voltage across its bit lines, and is read by detecting a differential discharge across the bit lines. Each memory cell 200 includes a storage cell made up of four transistors: PMOS load transistors 212 and cross-coupled NMOS storage transistors 214. The cell is operable in any one of three modes: static mode, write mode, and read mode.

Figure 2:
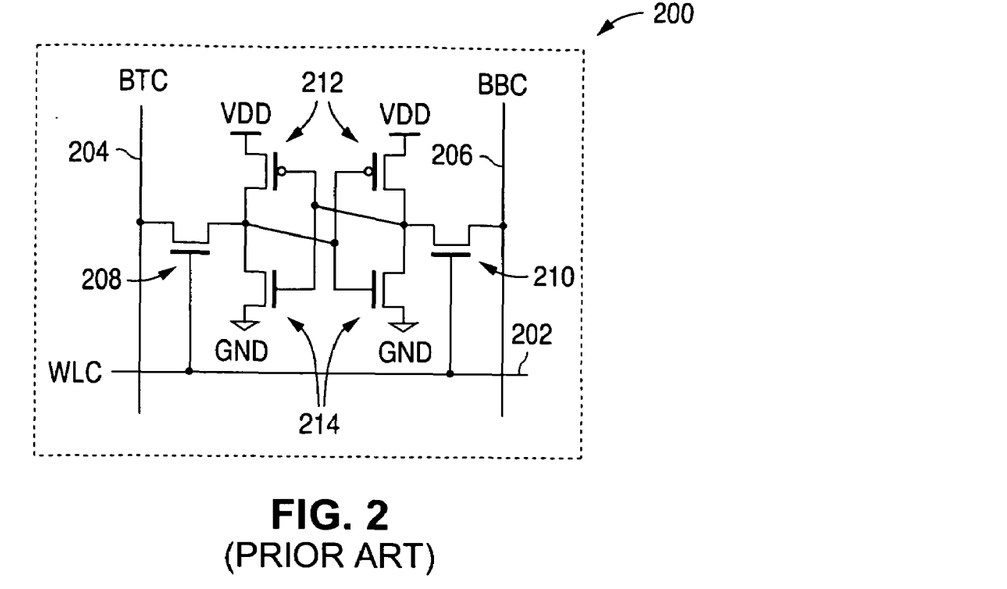
FIG. 2 is a schematic circuit diagram of a prior art memory cell.

During static mode, charge is maintained on the bit cells by keeping the word line 202 at logic zero (Ground) while precharging the bit lines 204, 206 to VDD.

In write mode, a logic 1 or 0 is programmed into the memory cell 200 by driving the word line 202 to a logic 1 and applying a differential voltage across the bit lines 204, 206 (logic 1 on bit line 204, and logic 0 on bit line 206 programs the cell 200 to a logic 1, and vice versa).

During read mode, a differential voltage is detected across the bit lines by driving the word line 202 to logic 1 and allowing the bit lines to discharge. The logic state of the bit cell 200 determines the nature of the discharge. For instance, if the cell was programmed to logic 0 (bit line 206 driven to logic 1 and bit line 204 driven to logic 0) then bit line 204 would discharge and bit line 206 would remain at VDD since before each read and write, all bitlines are precharged to VDD. Thus, if the logic state of the bit cell is 1, bit line 204 will be maintained at VDD.

Referring to FIG. 1, during static mode all memory cells are precharged to logic 1 by PMOS transistors 102. By applying a low voltage to the gates of the PMOS transistors 102 by means of PRCHG input 104, VDD is applied to the bit lines of the various cells in the structure. During this mode, the word lines are kept low to avoid discharging of the bit lines. During a read or write mode, the precharge PMOS transistors 102 are switched off and one of the word lines is driven to logic 1. This results in all memory cells in that row to start discharging their bit lines, which results in a large active power AC power dissipation. In order to write to or read from a particular memory cell, one of the switches 110 in the multiplexer block 112 is selected. This selects one of the columns. Writing to a memory cell (also referred to as a bit cell) requires the use of a write circuit 114 to apply a differential voltage across the bit lines by providing a differential voltage across the lines 120, 122. During read mode the differential voltage across the bit lines is detected using a sense amplifier and routing this to the output circuit. In FIG. 1, the write circuit and sense amplifier are depicted as a single block 114.

Figure 3:
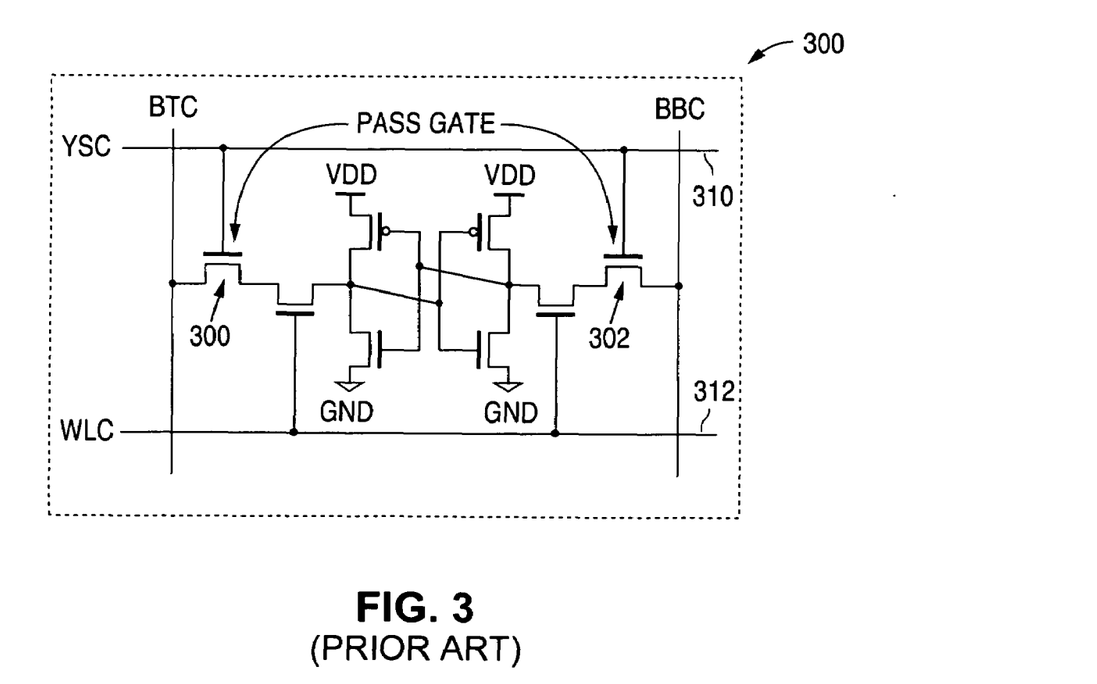
FIG. 3 is a schematic circuit diagram of another prior art memory cell.

It will be appreciated that during each read or write operation, an entire row of precharged memory cells is discharged, thereby consuming a lot of AC power. It is therefore desirable to reduce this power consumption. One such approach was described in prior US patent application owned by the same assignee and entitled "Low Power SRAM Architecture". This solution made use of 8 transistor (8T) memory cells 300 as shown in FIG. 3, in which two extra pass gates 302 were provided and controlled by an additional control line 310. As shown in the memory structure of FIG. 4, each of the control lines 310 controls a column of memory cells 300, while the word lines still control rows of memory cells. Thus the control lines 310, in conjunction with the word lines 312, allow a single memory cell 300 to be selected during the read or write operation and thereby cause only a single memory cell to discharge.

Figure 4:
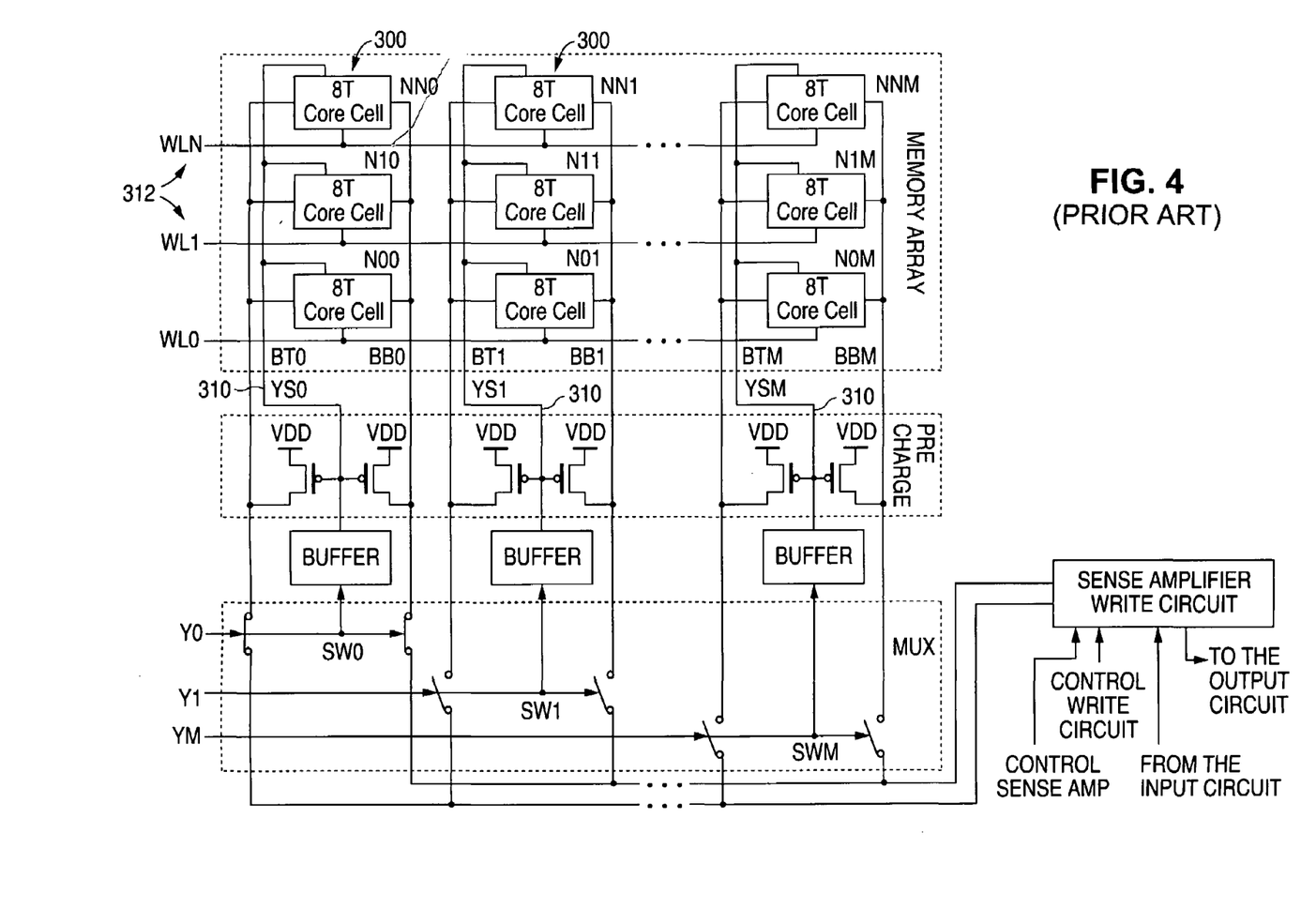
FIG. 4 is a schematic circuit diagram of another prior art SRAM structure.

While this results in a substantial power saving, each of the additional control lines 310 connects to each of the memory cells in a column. Thus the larger the number of rows in the memory array, the larger the number of memory cells in a column. This presents a substantial load to the control lines 310. Since the control lines 310 have to be charged and discharged whenever there is an address change, a substantial amount of power is consumed by the added control lines. The present invention seeks to address this issue.

SUMMARY OF THE INVENTION

The present invention provides a method and structure for reducing power consumption by reducing the load on control lines used to select memory cells in Static Random Access Memory (SRAM) during read and write operations.

According to the invention, there is provided a memory structure comprising a plurality of memory cells wherein each memory cell is individually selectable, a plurality of row select lines, a plurality of column select lines, and a plurality of sector select lines. Each of the sector select lines typically controls a plurality of memory cells in a column and may be ANDed with the column select lines. Typically the row select lines are word lines, and the column select lines are additional control lines that allow a specific memory cell to be selected in a row.

Further, according to the invention, there is provided a method of reducing the power consumption in a SRAM structure that has word lines and column select lines for selecting specific memory cells, comprising reducing the load on the column select lines by dividing the structure into sectors of multiple rows each and limiting the number of load elements seen by the column select lines to the number of sectors.

The load may be reduced by logically ANDing each of the column select lines with a plurality of sector select lines, wherein each of the sector select lines controls a sector of two or more rows of memory cells.

DETAILED DESCRIPTION OF THE INVENTION

Figures 5, 5A:
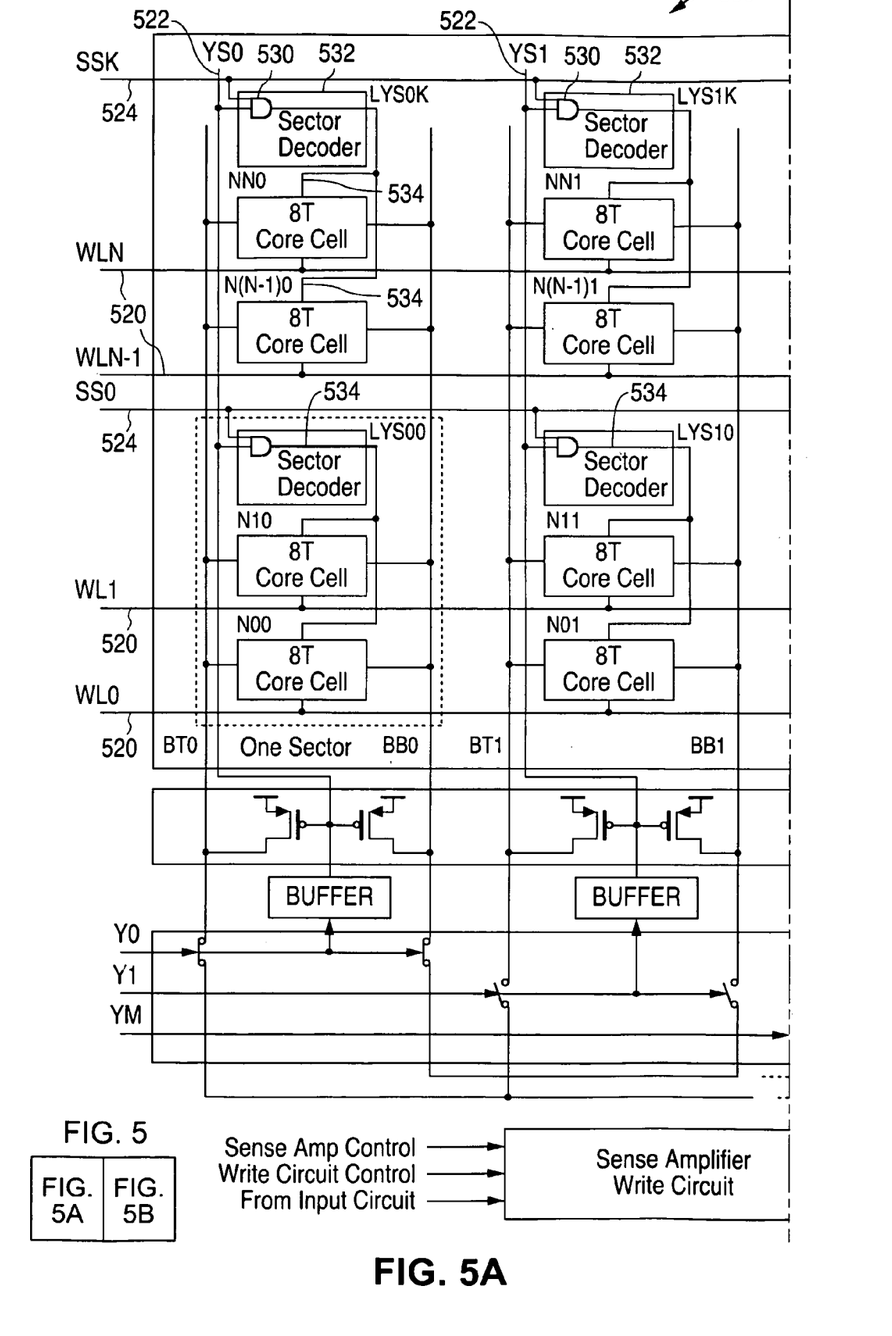
FIG. 5 is a schematic circuit diagram of one embodiment of a SRAM structure of the invention.
Figure 5B:
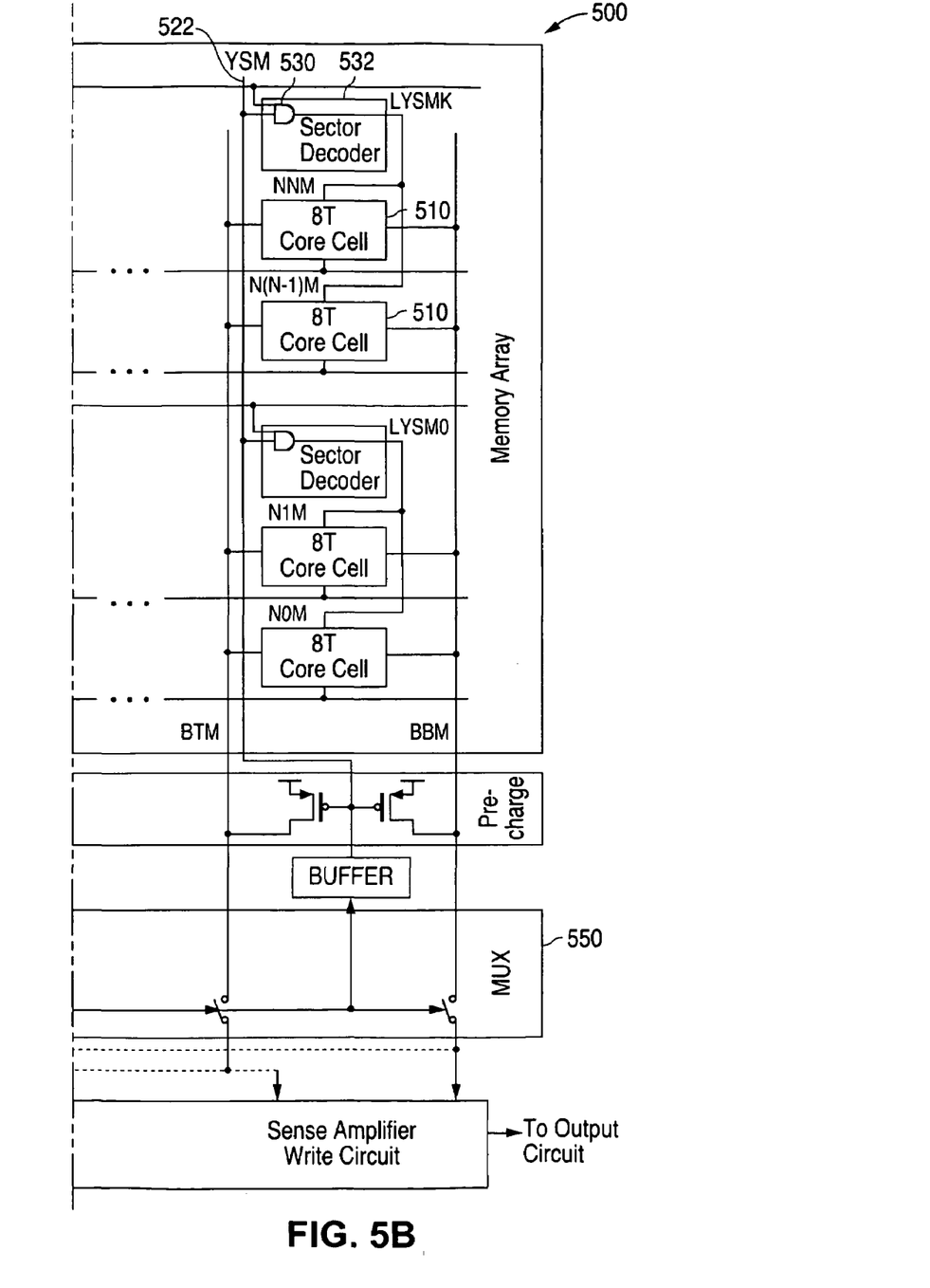

FIG. 5 shows one embodiment of a RAM structure 500 of the invention.

The structure 500 includes a matrix of memory cells 510 arranged in rows and columns. Thank you—I have added it Each memory cell 510 takes the form of a 8 transistor (8T) memory cell as illustrated in the prior art cell of FIG. 3. Each of the cells 510 is addressable individually by means of row select lines in the form of word lines 520 (WL0-N), and local column select lines 534 (LYS00 . . . LYSMK). Local column selects are enabled by column select 522 (YS) and sector selects 524 (SS). As can be seen in FIG. 5, groups of rows in the matrix are divided into sectors addressable by the sector select lines 524 (SS0-K). In the present embodiment two rows are included in each sector. As shown in the circuit of FIG. 5, the column select lines 522 are not connected directly to the memory cells. Instead, the column select lines 522 are logically ANDed with certain of the sector select lines 524 by means of AND gates 530, which form part of sector decoders 532.

It will be appreciated that the sector decoders could be implemented in different ways, e.g., using pass gates or other combinational logic. Thus the ANDing need not necessarily involve the use of AND gates. By ANDing a plurality of column select lines 522 with the sector select lines 524, wherein the number of sectors is less than the number of rows (since each sector includes more than one row), the load seen by the signals on the column select lines 522 is reduced.

The outputs from the AND gates 530, in effect, provide local Y select lines 534 (LYS00-LYSMK). It will be appreciated that the local Y select lines 534 will be presented with a load corresponding to the number of rows in the sector. Thus the larger the number of rows per sector the greater the load. On the other hand, by reducing the number of rows per sector, the load seen by the column select lines 522 increases. Also, the number of sector decoders 532 increases, thus requiring more area.

The number of bit cells or memory cells 510 per sector in a column has, for ease of implementation, been chosen as any number in the power of two. Thus for a 256×256 memory matrix, the number of columns could be divided into 16 sectors. If the load presented by each sector decoder 532 is similar to the load of a memory cell 510, this would present both the column select lines 522 and local Y select lines 534 with similar loads. (The local Y select lines 534 will each see 16 memory cells 510, and the column select lines 522 will each see 16 AND gates). It will, therefore, be appreciated that the number of rows in a sector is also limited by the number of rows that each sector decoder 532 can drive. As regards the load on the sector select lines 524, this depends on the number of active columns in the matrix. This depends on the multiplexer 550 option. Where 16 columns are controlled by the mux 550, the sector select lines 524 will therefore see a load of 16 sector decoders. Thus the total active load for each read/write cycle (not taking into account the load seen by the word line, since this remains unchanged) will be the equivalent of 48 bit cells or memory cells (16 bit cell equivalents for each of the relevant column select line 522, local Y select line 534, and sector select line 524, insofar as the load of a sector decoder is substantially the same as that of a memory cell or bit cell). The present embodiment therefore replaces the 256 bit cell load on the column address line with an effective 16 bit cell load on the column address line 522, a 16 bit cell load on the local select line 534, and a 16 bit cell load on the sector select line 524—a reduction from 256 to 48.

No additional address signals are needed for the sector decoders, since the sector select lines 524 are chosen by the same addresses used by the Xdecoder for selecting word lines.

Figures 6, 6A:
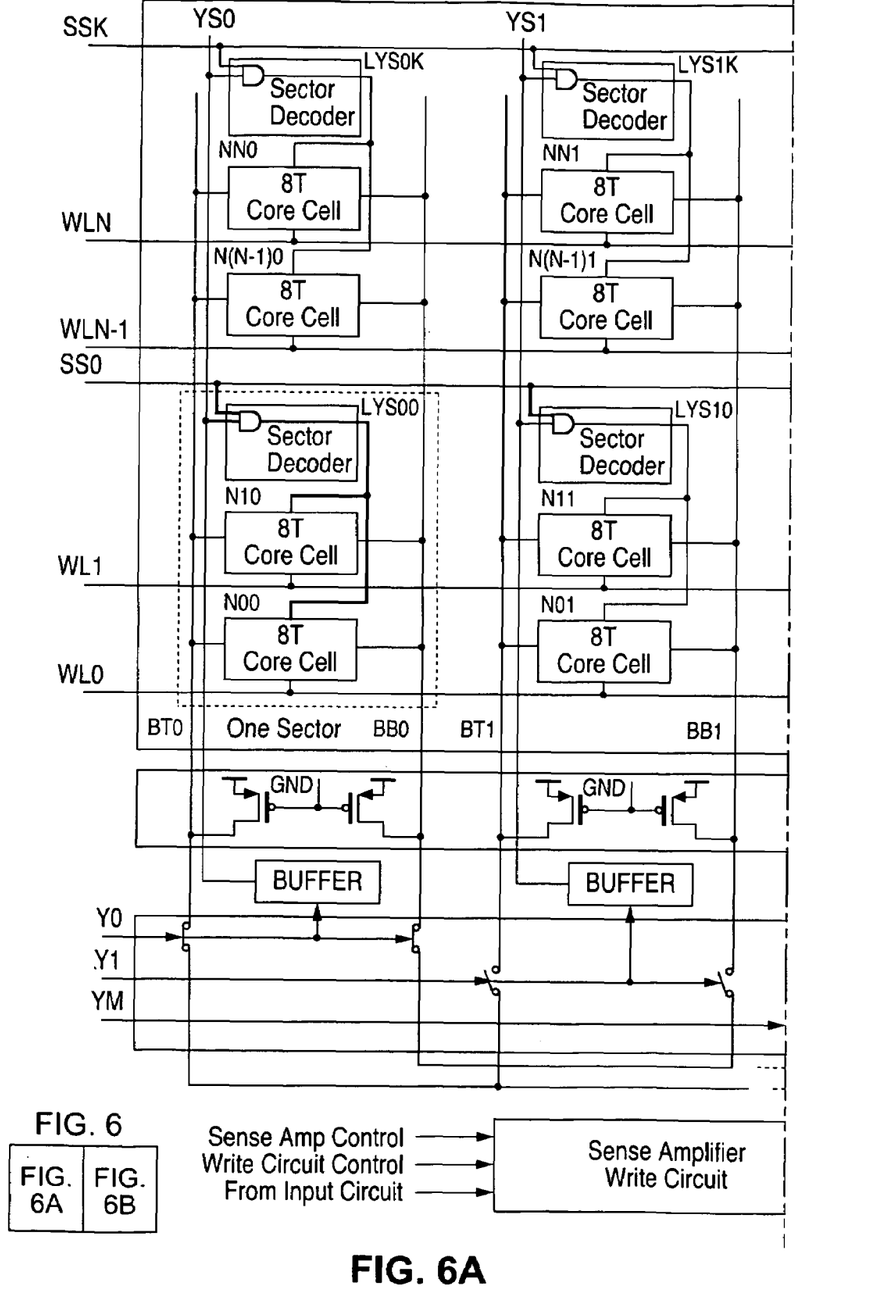
FIG. 6 is a schematic circuit diagram of another embodiment of a SRAM structure of the invention
Figure 6B:
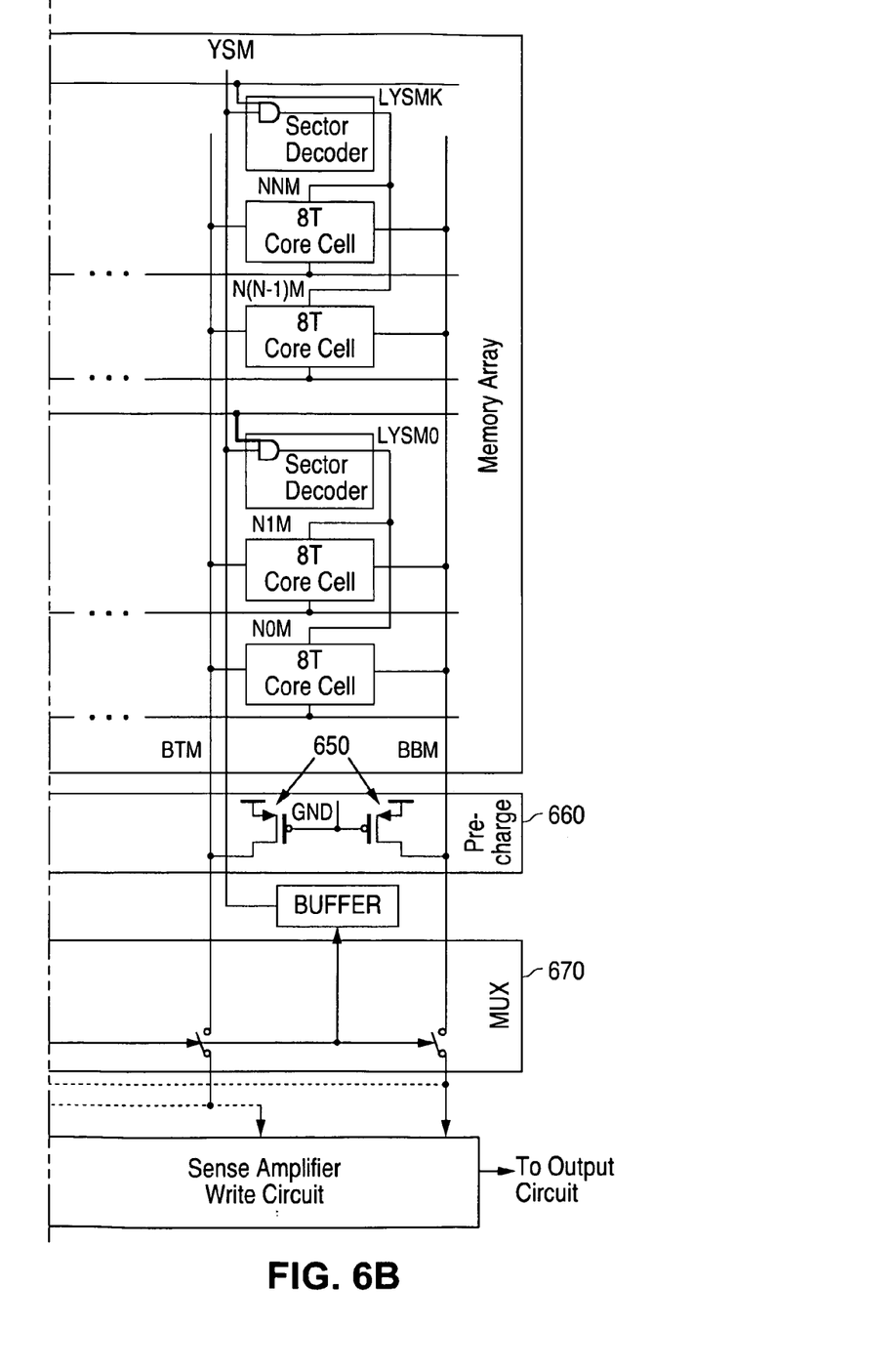

While the above embodiment discussed a synchronous SRAM architecture, the technique can also be applied to asynchronous SRAM as illustrated in FIG. 6. The asynchronous structure distinguishes itself only in that the precharging in asynchronous SRAM is not clocked and always stays at logic 1. To achieve this, the PMOS transistors 650 of the precharge block 660 have their gates permanently tied to ground instead of being controlled by signals from the multiplexer 670. Thus the bit lines to the memory cells are permanently held high, allowing precharging to occur whenever the word lines are low. During a write operation a differential voltage is applied across the bit lines of the selected columns and one of the word lines goes high to select the appropriate cells. During the read operation the word line is held high to allow the bit lines to discharge, and the differential voltage is detected.

In both synchronous and asynchronous applications, the present invention thus achieves a significant power saving over the prior art by making use of sector select lines. It will be appreciated that the SRAM structure could be implemented in different ways without departing from the scope of the invention as defined in the claims.

The invention claimed is:

1. An SRAM memory structure, comprising
    a plurality of 8T memory cells arranged in rows and columns, and defining multiple sectors, each sector comprising multiple rows and the sectors together defining all of the rows of the memory structure,
    a plurality of word lines for selecting rows of memory cells in the structure by being connected to transistor gates within the 8T memory cells,
    a plurality of column select lines for selecting columns of memory cells by being connected to transistor gates within the 8T memory cells,
    a pair of bit lines for each memory cell, and
    a plurality of sector select lines for defining shortened sections of columns, wherein each column select line is logically ANDed with each sector select line to define a local select line to allow the memory cells in the column corresponding to said column select line but limited to the sector corresponding to the desired sector select line to be selected for discharging, and wherein a column select line together with a word line and sector select line allows an individual memory cell to be selected for discharging.

2. A memory structure of claim 1, wherein each of the sector select lines controls a sector of two or more rows.

3. A memory structure of claim 1, wherein the logical ANDing is achieved through the use of AND gates, pass gates or other combinational logic.

4. A method of reducing the power consumption in a SRAM structure of 8T memory cells that has bit lines, and further has word lines and column select lines that are directly connected to gates of the transistors of the 8T memory cells for selecting specific memory cells for reading, comprising providing sector select lines, and reducing the load on the column select lines by dividing the structure into multiple sectors of multiple rows each to avoid the column select lines having to connect directly to each 8T memory cell in a column, and controlling the memory cell discharge by logically ANDing the column select lines with the sector select lines to control the memory cells corresponding to a particular column and sector, and additionally using the word lines to control specific memory cells in said column and sector.

5. A method of claim 4, wherein the load is reduced by logically ANDing each of the column select lines with a plurality of sector select lines instead of connecting the column select lines directly to the memory cells, wherein each of the sector select lines controls a sector of two or more rows of memory cells.

6. A method of claim 5, wherein the ANDing is performed by ANDing logic elements to define local select lines that are connected to memory cells in a sector.

7. A method of claim 6 wherein the load on each of the column select lines is determined by the number of ANDing logic elements in the column, and the load on each local select line is determined by the number of memory cells in the sector and column of said local select line.

8. An SRAM memory structure, comprising a plurality of 8T memory cells arranged in rows and columns, and defining multiple sectors, each sector comprising multiple rows and the sectors together defining all of the rows of the memory structure, a plurality of word lines for selecting rows of memory cells in the structure by being directly connected to transistor gates of the memory cells, a plurality of column select lines, and a plurality of sector select lines, wherein each column select line together with a sector select line allows the memory cells in the column corresponding to said column select line but limited to the sector corresponding to said sector select line to be selected for discharging, and wherein the combination of row select lines, column select lines, and sector select lines allow individual memory cells to be selected for discharging during a read operation.

9. A memory structure of claim 8, wherein each of the sector select lines controls a sector of two or more rows.

10. A memory structure of claim 9, wherein each sector select line is logically ANDed with the column select lines to define local select lines for selecting memory cells in a sector.

* * * * *